United States Patent
Yoo et al.

(10) Patent No.: US 10,670,959 B2
(45) Date of Patent: Jun. 2, 2020

(54) PELLICLE AND METHOD OF USING THE SAME

(71) Applicant: TAIWAN SEMICONDUCTOR MANUFACTURING COMPANY, LTD., Hsinchu (TW)

(72) Inventors: Chue San Yoo, Hsinchu (TW); Hsin-Chang Lee, Zhubei (TW); Pei-Cheng Hsu, Taipei (TW); Yun-Yue Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

(21) Appl. No.: 15/591,640

(22) Filed: May 10, 2017

(65) Prior Publication Data
US 2018/0329288 A1   Nov. 15, 2018

(51) Int. Cl.
*G03F 1/64* (2012.01)
*G03F 7/20* (2006.01)
*G03F 1/62* (2012.01)
*G03F 1/00* (2012.01)

(52) U.S. Cl.
CPC .............. *G03F 1/64* (2013.01); *G03F 1/14* (2013.01); *G03F 1/142* (2013.01); *G03F 1/62* (2013.01); *G03F 7/2004* (2013.01)

(58) Field of Classification Search
CPC ... G03F 1/14; G03F 1/142; G03F 1/62; G03F 1/64; G03F 7/20
See application file for complete search history.

(56) References Cited

U.S. PATENT DOCUMENTS

| | | | | |
|---|---|---|---|---|
| 4,833,051 A | * | 5/1989 | Imamura | G03F 1/64 269/21 |
| 5,772,842 A | * | 6/1998 | Tanaka | B29C 63/0013 156/718 |
| 5,953,107 A | * | 9/1999 | Li | G03F 1/64 355/74 |
| 6,573,980 B2 | * | 6/2003 | Wang | G03F 1/62 355/30 |
| 6,841,312 B1 | * | 1/2005 | Kalk | G03F 1/64 355/75 |
| 6,911,283 B1 | * | 6/2005 | Gordon | G03B 27/62 355/75 |

(Continued)

FOREIGN PATENT DOCUMENTS

| | | | | |
|---|---|---|---|---|
| JP | 04-152344 | * | 5/1992 | G03F 1/14 |
| JP | 05-188583 | * | 7/1993 | G03F 1/14 |

(Continued)

OTHER PUBLICATIONS

"Reusable Pellicle for 1X masks", Research Disclosures RD259035 (Nov. 1985).*

*Primary Examiner* — Martin J Angebranndt
(74) *Attorney, Agent, or Firm* — Hauptman Ham, LLP

(57) ABSTRACT

A pellicle includes a frame. The frame includes a check valve, wherein the check valve is configured to permit gas flow from an interior of the pellicle to an exterior of the pellicle. The frame further includes a recess in a bottom surface of the frame. The pellicle further includes a membrane extending across the frame. The pellicle further includes a gasket configured to fit within the recess.

17 Claims, 6 Drawing Sheets

(56) References Cited

U.S. PATENT DOCUMENTS

| | | | |
|---|---|---|---|
| 2002/0164547 A1* | 11/2002 | Ferm | G02B 6/1221 430/321 |
| 2007/0002516 A1* | 1/2007 | Matsumoto | G03F 1/66 361/234 |
| 2008/0199783 A1* | 8/2008 | Chang | G03F 1/48 430/5 |
| 2010/0297562 A1* | 11/2010 | Shibazaki | G03F 7/70691 430/325 |
| 2014/0255827 A1* | 9/2014 | Wang | G03F 1/64 430/5 |
| 2014/0367248 A1* | 12/2014 | Goldfarb | G03F 7/70983 204/263 |
| 2016/0154299 A1* | 6/2016 | Choi | G03F 1/64 430/5 |

FOREIGN PATENT DOCUMENTS

| | | | | |
|---|---|---|---|---|
| JP | 2006-091667 | * | 4/2006 | G03F 1/14 |
| WO | 02/069379 | * | 9/2002 | G03F 1/24 |

* cited by examiner

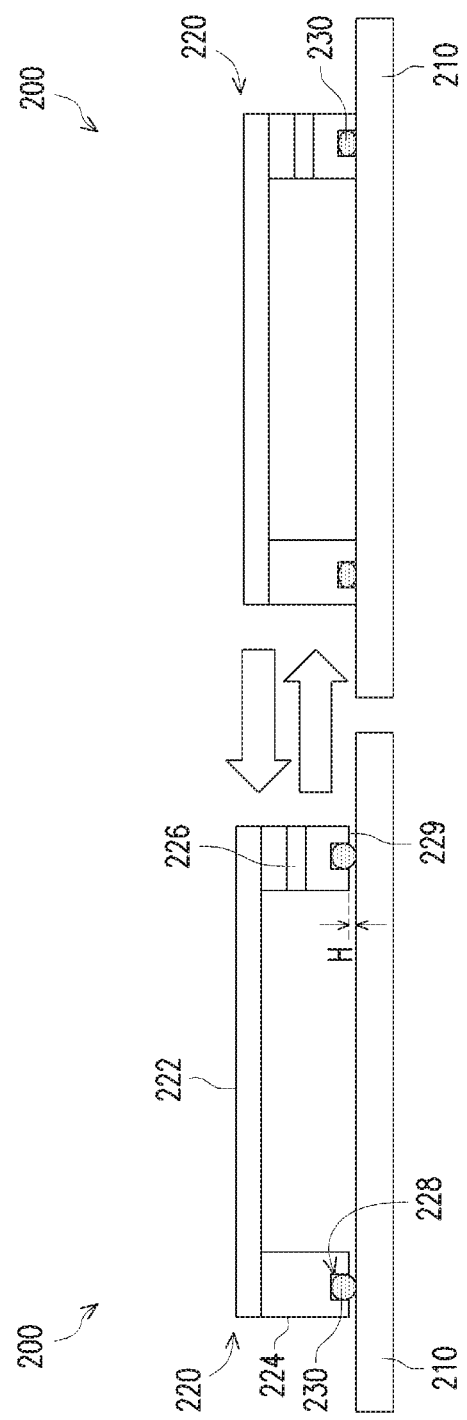

PELLICLE AND METHOD OF USING THE SAME

BACKGROUND

Pellicles are used to protect masks (also called reticles) from particles to reduce errors in transferring a pattern from the mask to a wafer. Pellicles include a frame which attaches to the mask; and a membrane extending across the frame. In some approaches the frame is secured to the mask using an adhesive.

In some approaches, the pellicle remains on the mask during a photolithography process. Light that passes through the membrane when a pellicle remains on the mask during the photolithography process has a reduced intensity due to absorption and scattering of the light incident on the membrane. In some approaches, the pellicle is removed from the mask prior to the photolithography process, such as an extreme ultraviolet (EUV) photolithography process. A cleaning process is used to remove adhesive used to secure the frame to the mask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a cross-sectional view of a pellicle separated from a mask in accordance with some embodiments.

FIG. 2B is a cross-sectional view of a pellicle secured to a mask in accordance with some embodiments.

DETAILED DESCRIPTION

Figure 1:
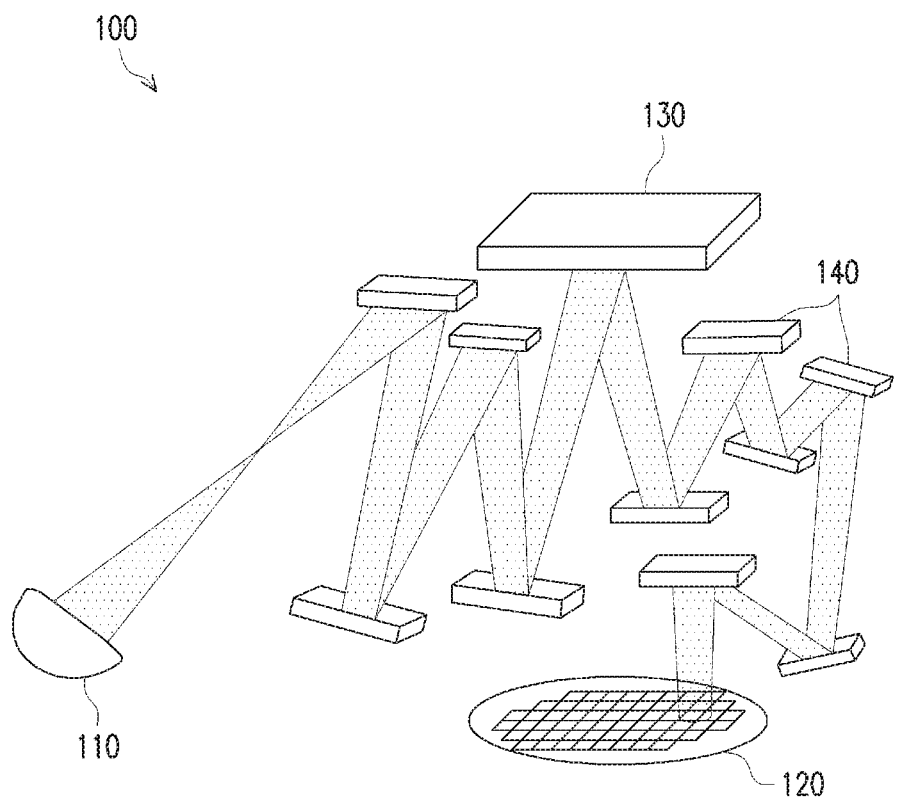
FIG. 1 is a schematic diagram of a photolithography arrangement in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described below is usable in many applications, including fin-type field effect transistors (FinFETs). For example, the fins may be patterned to produce a relatively close spacing between features, for which the present disclosure is well suited. In addition, spacers used in forming fins of FinFETs, also referred to as mandrels, are able to be processed according to the following description.

Pellicles help to prevent particles from contacting a surface of a mask and negatively impacting transfer of a pattern of the mask to a wafer. Particles on the surface of the mask scatter incident light which causes variations in the pattern and increases a risk of the pattern on the wafer failing to satisfy critical dimension requirements, such as feature size, feature spacing, or the like.

In some approaches that maintain the pellicle on the mask during a photolithography process, the light passing through a membrane of the pellicle has a reduced intensity. The intensity is reduced because of absorption and scattering of light by the membrane. In approaches that use a reflective mask to transfer the pattern to the wafer, the light will pass through the membrane two times, which doubles the effect of the reduction of intensity of the light. The decreased intensity of light incident on the wafer increases a dwell time of the light on the wafer in order to effectively transfer the pattern to the wafer. The dwell time is a duration of time during which the light is incident on the wafer. The dwell time is increased because the amount of photon energy to effectively transfer the pattern to the wafer remains unchanged, but the amount of photon energy of the light passing through the membrane is reduced as discussed above. The increased dwell time in turn reduces production throughput and production capacity.

In some approaches that remove the pellicle from the mask prior to the photolithography process, a cleaning process is used to remove residual adhesive from the mask. The adhesive is used to secure the pellicle to the mask when the mask is not in use. However, the residual adhesive that remains on the mask following removal of the pellicle increases a risk of light scattering as a result of the residual adhesive, which negatively impacts the precision of transferring the mask pattern to the wafer. The cleaning process presents a risk to damage the pattern of the mask. The risk of damage to the mask increases as the number of cleaning processes performed on the mask increases. Thus, repeated attachment and removal of the pellicle increases a risk of damage to the mask. Damage to the pattern of the mask will negatively impact the accurate transfer of the desired pattern to the wafer. The risk of damage is significant for extreme ultraviolet (EUV) photolithography because the silicon-based membranes will absorb EUV radiation, in some instances.

In addition, as the surface of the mask is exposed to an ambient environment, carbon growth on the surface of the mask increases a risk of altering the pattern on the mask. The carbon growth is a result of reactions between the material of the mask and the ambient environment. For example, a ruthenium capping layer for a mask, such as a mask for EUV photolithography, reacts with carbon dioxide in the ambient environment to result in carbon growth on the ruthenium mask. In some technology nodes, for example, N10, the carbon growth on the mask raises a critical dimension (CD) of the mask pattern to the point that the pattern cannot be reliably transferred to the wafer. Attaching the pellicle to the mask using an adhesive traps the ambient environment against the surface of the mask. Some embodiments of this description include the ability to use an inert gas environment between the pellicle and the mask in order to reduce or prevent carbon growth on the surface of the mask.

FIG. 1 is a schematic diagram of a photolithography arrangement 100 in accordance with some embodiments. Photolithography arrangement 100 includes a light source 110. Light source 110 is configured to emit electromagnetic radiation for patterning a wafer 120. A mask 130 is located along an optical path between light source 110 and wafer 120. Optical components 140 transfer the light from light source 110 to mask 130 and then to wafer 120.

Light source 110 generates the electromagnetic radiation in a wavelength for patterning a photoresist on wafer 120. In some embodiments, light source 110 is an extreme UV (EUV) light source, a deep ultraviolet (DUV) light source, a vacuum UV (VUV) light source or another suitable light source. In some embodiments, light source 110 is a laser, a diode or another suitable light generating element. In some embodiments, light source 110 includes a collector configured to direct electrode magnetic radiation in a common direction along the optical path. In some embodiments, light source 110 includes a collimator configured to direct all beams of electromagnetic radiation parallel to each other.

Wafer 120 includes a substrate, e.g., a semiconductor substrate, having a photoresist layer thereon. A material of the photoresist is matched to a wavelength of the electromagnetic radiation emitted by light source 110. In some embodiments, the photoresist is a positive photoresist. In some embodiments, the photoresist is a negative photoresist. In some embodiments, wafer 120 includes active components. In some embodiments, wafer 120 includes an interconnect structure.

Mask 130 includes a pattern thereon to be transferred to wafer 120. Mask 130 is free of residual adhesive. Mask 130 is configured to directly receive incident light without the light passing through a pellicle. Mask 130 also has minimal or no carbon growth thereon. Mask 130 is a reflective mask configured to reflect incident light. In some embodiments, mask 130 is a transmissive mask configured to transmit incident light.

Optical components 140 are configured to transfer light from light source 110 to mask 130 and from mask 130 to wafer 120. Optical components 140 reduce a size of the pattern on mask 130 so that a size of the pattern formed on wafer 120 is smaller than a size of the pattern on mask 130. In some embodiments, a ratio of the size of the pattern on mask 130 to the size of the pattern on wafer 120 is 2:1; 4:1; 5:1; or another suitable reduction ratio. Optical components 140 are reflective elements and photolithography arrangement 100 is a catoptric arrangement. In some embodiments, at least one of optical components 140 is a transmissive element, and photolithography arrangement 100 is a catadioptric arrangement.

By reducing or avoiding residual adhesive on mask 130, the precision of the pattern transfer from mask 130 to wafer 120 is increased. In addition, the minimal or lack of carbon growth on mask 130 also helps to increase precision of the pattern transfer. Avoiding cleaning processes to remove carbon growth and/or residual adhesive helps to increase the useful life of mask 130 and improve profitability of a manufacturing process using photolithography arrangement 100.

FIG. 2A is a cross-sectional view 200 of a pellicle 220 separated from a mask 210 in accordance with some embodiments. Mask 210 is usable to transfer a pattern to a wafer, e.g., using photolithography arrangement 100 (FIG. 1). Pellicle 220 is separated from mask 210 by a separation height H. Pellicle 220 includes a membrane 222 extending across a frame 224. A check valve 226 is located in frame 224. A gasket 230 is located within a recess 228 in frame 224.

Mask 210 includes a pattern on a surface thereof. The pattern includes multiple opaque portions defining either reflective or transmissive portions. The reflective or transmissive portions determine which portions of light incident on mask 210 are transferred to a wafer, e.g., wafer 120 (FIG. 1). Mask 210 extends beyond an edge of the pellicle 220. In some embodiments, a carrier (not shown) is attached to mask 210 to facilitate handling of mask 210.

Pellicle 220 is configured to protect the pattern on mask 210 by blocking foreign particles from adhering to mask 210. Membrane 222 is a transparent layer extending across frame 224. In some embodiments, membrane 222 is opaque. In some embodiments, membrane 222 includes nitrocellulose, fluororesin, quartz, plastic resin or another suitable material. In some embodiments, membrane 222 is a silicon-based membrane, such as a membrane including a stack of silicon nitride/p-doped silicon/silicon nitride/silicon carbide; a stack of silicon nitride/p-doped silicon/silicon nitride/ruthenium; or a stack of silicon carbide/silicon nitride. In some embodiments, a thickness of membrane 222 ranges from about 2 microns ($\mu m$) to about 7 $\mu m$. As a thickness of membrane 222 increases, a risk of breakage of the membrane decreases; however, a weight of membrane 222 increases. The thickness of membrane 222 is sufficient to provide the membrane with enough mechanical strength to withstand a vacuum in the region between pellicle 220 and mask 210.

Frame 224 is configured to maintain a separation between membrane 222 and mask 210. Frame 224 is configured to contact mask 210 at positions surrounding the pattern on mask 210. Frame 224 extends continuously around the pattern on mask 210 to help ensure protection from foreign particles. In some embodiments, frame 224 includes a plastic material, aluminum or another suitable material. In some embodiments, frame 224 is rectangular, circular or another suitable shape. In some embodiments, an adhesive is used to attach membrane 222 to frame 224.

Check valve 226 is configured to control gas flow between an ambient environment exterior of pellicle 220 and a region within the pellicle, i.e., between the pellicle and mask 210. Check valve 226 is configured to inhibit gas flow from the ambient environment into the region within the pellicle 220. In some embodiments, check valve 226 is a ball check valve, a lift check valve or another suitable type of check valve. In some embodiments, check valve 226 includes plastic, aluminum or another suitable material. In some embodiments, a material of check valve 226 is a same material as frame 224. In some embodiments, a material of check valve 226 is different from a material of frame 224.

Frame 224 includes a single check valve 226. In some embodiments, multiple check valves 226 are present in frame 224 to provide redundant control for gas flow between the ambient environment and the region within pellicle 220. For example, if one check valve 226 becomes defective, another check valve 226 could be used to remove gas between mask 210 and pellicle 220 and/or permit gas to enter between the pellicle and the mask.

Recess 228 extends continuously along a bottom surface of frame 224. Recess 228 is centered in the bottom surface of frame 224. In some embodiments, recess 228 is offset from a center of the bottom surface of frame 224. Recess 228 has a rectangular shape. In some embodiments, recess 228 has a triangle, circular or other suitable shape.

A depth of recess 228 is sufficient to partially accept gasket 230 into the recess. In some embodiments, a depth of recess 228 is equal to a thickness of gasket 230 in a relaxed state. In some embodiments, the depth of recess 228 is less than the thickness of gasket 230 in the relaxed state. The relaxed state of gasket 230 is the state when no force, other than a weight of pellicle 220 is exerted on gasket 230. The depth of recess 228 relative to the thickness of gasket 230 in the relaxed state determines the separation height H between the bottom surface of frame 224 and mask 210. In some embodiments, separation height H ranges from about 2 μm to about 50 μm. As separation height H increases, a stronger vacuum is able to be created in the region between mask 210 and pellicle 220. The stronger vacuum removes more gas from the region between mask 210 and pellicle 220 to reduce the risk of carbon growth; however, a risk of damage or deformation of mask 210 also increases. In some instances, if the separation height H is too small, the vacuum formable between mask 210 and pellicle 220 does not have sufficient pressure to hold pellicle 220 in place during storage.

Gasket 230 is a resilient material configured to help seal the region between pellicle 220 and mask 210 from the ambient environment. Gasket 230 extends continuously around the pattern in mask 210 and fits within recess 228. In some embodiments, gasket 230 is fixed to frame 224 by an adhesive or another suitable manner of fixing. In some embodiments, gasket 230 is separable from frame 224. Gasket 230 has a circular cross-section. In some embodiments, gasket 230 has a rectangular cross-section, a triangular cross-section or another suitable shape. In some embodiments, gasket 230 includes rubber, resin, or another suitable material.

When a vacuum is applied to the region between pellicle 220 and mask 210, gasket 230 deforms in order to create an air-tight seal to prevent passage of gas. In some embodiments, a portion of gasket 230 extends between frame 224 and mask 210 to prevent frame 224 from directly contacting mask 210. In some embodiments, gasket 230 fits entirely within recess 228 and frame 224 directly contacts mask 210 when a vacuum is applied to the region between pellicle 220 and mask 210.

In some embodiments, an inert gas is used to purge the region between pellicle 220 and mask 210 prior to applying the vacuum. In some embodiments, the inert gas includes nitrogen gas, a halogen gas or another suitable inert gas. Purging using inert gas helps to further reduce interaction between the mask and gases in the ambient environment to further reduce the risk of carbon growth on mask 210.

Figure 4:
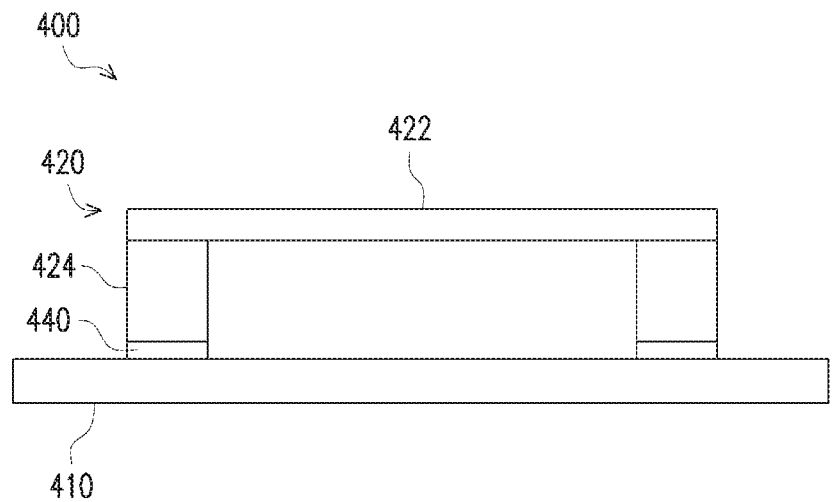
FIG. 4 is a cross-sectional view of a pellicle secured to a mask in accordance with some embodiments.

In some embodiments, a bottom surface 229 of frame 224 includes micro-suction cups (FIG. 5) or an electrostatic sticker (FIG. 4). Including the micro-suction cups or electrostatic sticker on bottom surface 229 helps to prevent the ambient environment from reaching inside of pellicle 220. In some embodiments, a magnitude of negative pressure create by a vacuum through check valve 226 is reduced when bottom surface 229 includes micro-suction cups or electrostatic sticker because the additional protection provided by the micro-suction cups or electrostatic sticker provides adequate protection for mask 210 using the reduced pressure.

FIG. 2B is a cross-sectional view 200' of pellicle 220 contacting mask 210 in accordance with some embodiments. In comparison with view 200, view 200' indicates an arrangement of pellicle 220 when a vacuum is applied to the region between pellicle 220 and mask 210. The vacuum causes the pressure in the ambient environment to press down on pellicle 220 and deform gasket 230 to create an air tight seal with mask 210.

A flow of gas is controlled based on check valve 226. As indicted by arrows between view 200 and view 200', pellicle 220 is able to transition from the arrangement in view 200 to the arrangement in view 200' without damage to the structure of pellicle 220. The ability to repeatedly secure pellicle 220 to mask 210 and remove pellicle 220 from mask 210 helps to increase the useful life of mask 210 and helps to ensure precise pattern transfer from mask 210 to a wafer.

Removing gas from the region between pellicle 220 and mask 210 to create the vacuum reduces a risk for carbon growth on the surface of mask 210. The reduced risk of carbon growth helps to ensure that the pattern of mask 210 does not change over time. Further, the use of a vacuum to secure and remove pellicle 220 to mask 210 avoids the use of adhesives on mask 210. Because no adhesives are used on mask 210, the cleaning process(es) for removing residual adhesives is also avoided, thereby reducing a risk of damage to the pattern of mask 210 by the cleaning process.

In some embodiments, where bottom surface 229 of frame 224 includes micro-suction cups (FIG. 5) or an electrostatic sticker (FIG. 4), a positive pressure is used to remove pellicle 220 from mask 210. In some embodiments, the positive pressure is generated by introducing an inert gas through check valve 226.

Figure 3A:
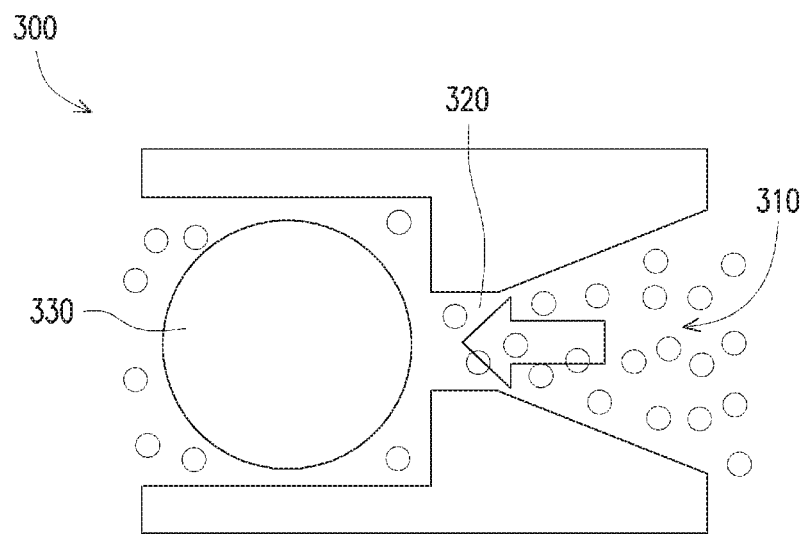
FIG. 3A is a cross-sectional view of a check valve for a pellicle in an arrangement for permitting gas flow in accordance with some embodiments.

FIG. 3A is a cross-sectional view of a check valve 300 for a pellicle in an arrangement for permitting gas flow in accordance with some embodiments. Check valve 300 is part of a pellicle, e.g., check valve 226 of pellicle 220 (FIG. 2A). Check valve 300 is an example of a ball check valve; however, one of ordinary skill in the art would understand that additional types of check valves are usable. Check valve 300 includes an opening 310 in connection with an interior of the pellicle. A port 320 connects opening 310 with an interior of check valve 300. A ball 330 is movable within check valve 300. In check valve 300, ball 330 is positioned to permit a flow of gas through port 320. A position of ball 330 is determined by a pressure differential between opening 310 and an interior of check valve 300. In some embodiments, ball 330 is biased against port 320 by a spring or other type of biasing element. In some embodiments, check valve 300 includes an element to mechanically displace ball 330 within check valve 300. For example, in some embodiments, a protrusion, or other suitable tool, is operable by a user to hold ball 330 in a position to permit flow from the interior of check valve 300 through port 320 into the interior of the pellicle. The ability to hold ball 330 in a position to permit flow into the interior of the pellicle would permit purging of the interior of the pellicle with an inert gas or assist with removal of the pellicle from the mask by creating a positive pressure inside the pellicle.

Figure 3B:
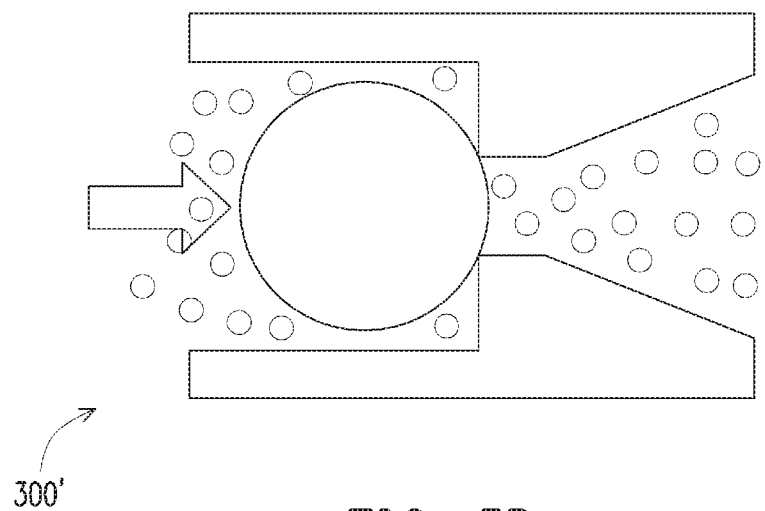
FIG. 3B is a cross-sectional view of a check valve for a pellicle in an arrangement for preventing gas flow in accordance with some embodiments.

FIG. 3B is a cross-sectional view of a check valve 300' for a pellicle in an arrangement for preventing gas flow in accordance with some embodiments. Check valve 300' includes a same structure as check valve 300, and same elements are not relabeled for the sake of clarity. In comparison with check valve 300, check valve 300' includes ball 330 located in position to prevent gas from passing through port 320. A higher pressure at the interior of check valve 300' forces ball 330 against port 320 to block gases from passing through port 320. In this way check valve 300' is able to help prevent gas from the ambient environment from reaching the pattern of the mask during storage of the mask. The reduced exposure to the gases of the ambient environment helps to reduce or avoid carbon growth on the mask to prolong the useful life of the mask.

FIG. 4 is a cross-sectional view 400 of a pellicle 420 secured to a mask 410 in accordance with some embodiments. Mask 410 is equivalent to mask 210 (FIG. 2A). Pellicle 420 is similar to pellicle 220. Membrane 422 is equivalent to membrane 222. In comparison with pellicle 220, pellicle 420 includes an electrostatic sticker 440 between frame 424 and mask 410. Pellicle 420 is free of a check valve and a recess in frame 424. Electrostatic sticker 440 is configured to secure frame 424 to mask 410 in an area surrounding a pattern on mask 410.

Electrostatic sticker 440 is attached to frame 424 by an adhesive or by another suitable attachment arrangement. Electrostatic sticker 440 includes a plastic film. The plastic film is able to adhere to mask 410 because of cohesive forces between the material of the plastic film and mask 410 acting to produce a vacuum between the two surfaces. The plastic film acts as though suction cups are holding the film to the mask 410. In some embodiments, a thickness of the plastic film ranges from about 0.1 millimeters (mm) to about 1.0 mm. A force of adhesion between electrostatic sticker 440 and mask 410 is less than if frame 424 were connected to mask 410 by an adhesive. However, by using electrostatic force to hold pellicle 420 to mask 410 instead of an adhesive, cleaning processes for removing residual adhesive are avoided which increases a useful life of mask 410.

Figure 5:
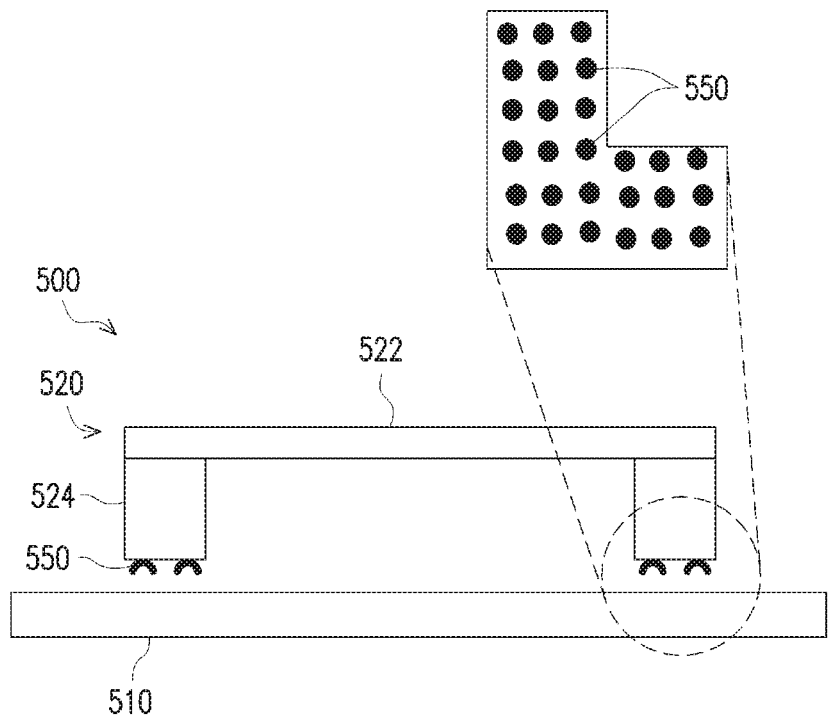
FIG. 5 is a cross-sectional view of a pellicle separated from a mask in accordance with some embodiments.

FIG. 5 is a cross-sectional view 500 of a pellicle 520 secured to a mask 510 in accordance with some embodiments. Mask 510 is equivalent to mask 210 (FIG. 2A). Pellicle 520 is similar to pellicle 220. Membrane 522 is equivalent to membrane 222. In comparison with pellicle 220, pellicle 520 includes a plurality of micro-suction cups 550 between frame 524 and mask 510. Pellicle 520 is free of a check valve and a recess in frame 524. Micro-suction cups 550 are configured to secure frame 524 to mask 510 in an area surrounding a pattern on mask 510.

Micro-suction cups 550 are arranged on a bottom surface of frame 524. The enlarged portion of view 500 includes micro-suction cups 550 aligned in a two-dimensional array on frame 524. In some embodiments, at least one micro-suction cup 550 in one row is offset from micro-suction cups 550 in an adjacent row. Offsetting of micro-suction cups 550 relative to one another helps to prevent foreign particles from contacting the pattern on mask 510 by travelling between adjacent micro-suction cups 550.

Micro-suction cups 550 include a flexible material, such as rubber, silicone, vinyl, urethane or other suitable materials. In some embodiments, a diameter of an individual micro-suction cup 550 ranges from about 5 µm to about 200 µm. As a size of an individual micro-suction cup increases an amount of force used to remove frame 524 from mask 510 increases. Frame 524 is secured to mask 510 by exerting a downward force on frame 524. In some embodiments, the downward force is exerted by a user. In some embodiments, the downward force is exerted by a tool, such as a robot arm or another suitable tool.

In some embodiments, micro-suction cups 550 are individually secured to frame 524. In some embodiments, several micro-suction cups 550 are integrally formed of a single piece of material and are secured to frame 524 as a group. In some embodiments, more than one group of micro-suction cups 550 are connected to frame 524. Micro-suction cups 550 are secured to frame 524 by adhesive or by another suitable attachment arrangement. Using micro-suction cups 550 to hold pellicle 520 to mask 510 instead of an adhesive, cleaning processes for removing residual adhesive are avoided which increases a useful life of mask 410.

In comparison with pellicle 220 (FIG. 2A), pellicle 420 (FIG. 4) and pellicle 520 (FIG. 5) do not help to reduce carbon growth on the corresponding mask because pellicle 420 and pellicle 520 do not include a check valve and the pellicles do not include an ability to create a vacuum between the pellicles and the corresponding masks. Due to the low force of adhesion for electrostatic sticker 440 and gaps between adjacent micro-suction cups 550, maintaining a vacuum between the pellicles and the corresponding masks would be difficult. As a result, the expense of increasing the complexity of the pellicle 420 or pellicle 520 to include the check valve is not warranted, in some instances. However, in comparison with other approaches, pellicle 420 and pellicle 520 are still able to protect the corresponding masks from foreign particles during storage and are removable without leaving residual adhesive; which helps to prolong the useful life of masks.

Figure 6A:
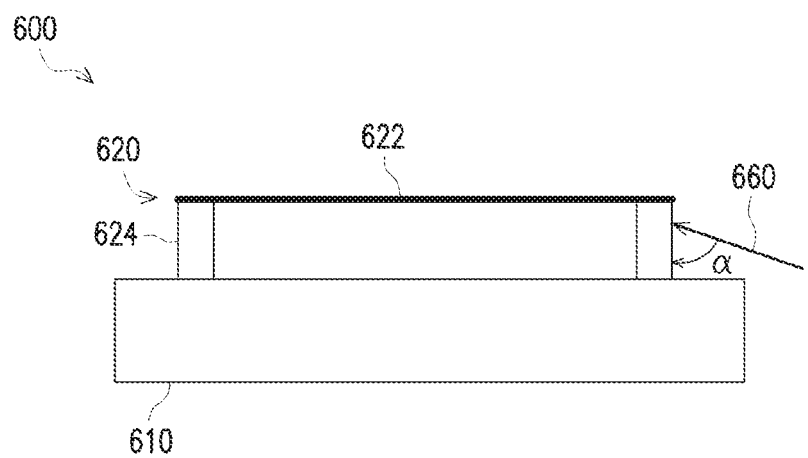
FIGS. 6A, 6B and 6C are cross-sectional views of a demounting process for a pellicle in accordance with some embodiments.

FIG. 6A is a cross-sectional view 600 of a demounting process for a pellicle 620 in accordance with some embodiments. Mask 610 is similar to mask 210, mask 410 or mask 510. Pellicle 620 is similar to pellicle 420 (FIG. 4) or pellicle 520 (FIG. 5). Membrane 622 is similar to membrane 422 or membrane 522. The specific attachment structure, e.g., electrostatic sticker 440 or micro-suction cups 550, between frame 624 and mask 610 are not shown for the sake of simplicity. In view 600, pellicle 620 is secured to mask 610. A force 660 is exerted on a side of pellicle 620 at an angle α with respect to an outer surface of frame 624.

Force 660 is used to demount the side of pellicle 620 from mask 610. Attempting to pull pellicle 620 away from mask 610 in a direction perpendicular to the top surface of mask 610 increases a risk of damage to pellicle 620 or mask 610. In order to reduce the risk of damage to pellicle 620 and mask 610, force 660 is exerted at angle α. In some embodiments, angle α ranges from about 20 degrees to about 80 degrees. As angle α increases an amount of force 660 exerted in a demounting direction, i.e., perpendicular to the top surface of mask 610, is reduced and a greater magnitude of force 660 is used to overcome the force securing pellicle 620 to mask 610. As angle α decreases, a risk of damage to pellicle 620 or mask 610 increases.

In some embodiments, force 660 is exerted using a robot arm or another piece of machinery controlled by a controller or by a user. In some embodiments, force 660 is exerted by the user. Force 660 is exerted at a single location on pellicle 620. In some embodiments, force 660 is exerted on multiple locations on pellicle 620. In some embodiments, a force exerted at a first location on pellicle 620 has a different angle or magnitude from a force exerted on a second location on pellicle 620.

Figure 6B:
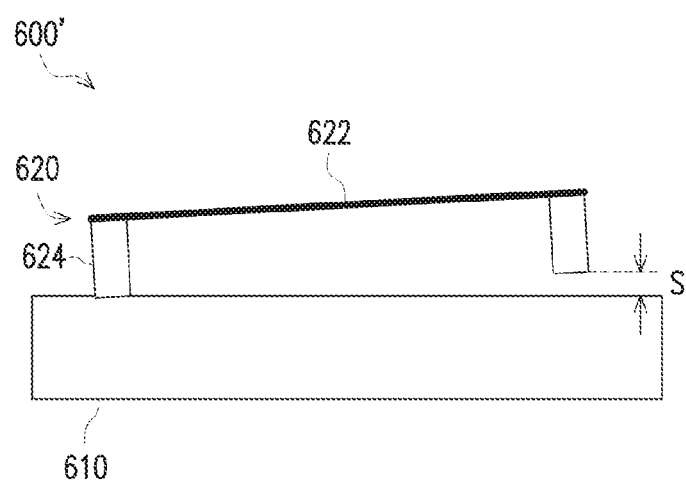

FIG. 6B is a cross-sectional view 600' of a demounting process for pellicle 620 in accordance with some embodiments. In comparison with view 600 (FIG. 6A), view 600' includes the side of pellicle 620 separated from mask 610 by a distance S. An opposite side of pellicle 620 remains in contact with mask 610. In some embodiments, a spacing element is inserted into separation distance S in order to help prevent pellicle 620 from reattaching to mask 610 during the demounting process. In some embodiments, separation distance S ranges from about 2 µm to about 5 µm. As the separation distance S increases, an amount of torque applied to pellicle 620 increases and a risk of damage to pellicle 620 increases. As the separation distance S decreases, a risk of pellicle 620 reattaching to mask 610 during the demounting process increases.

Figure 6C:
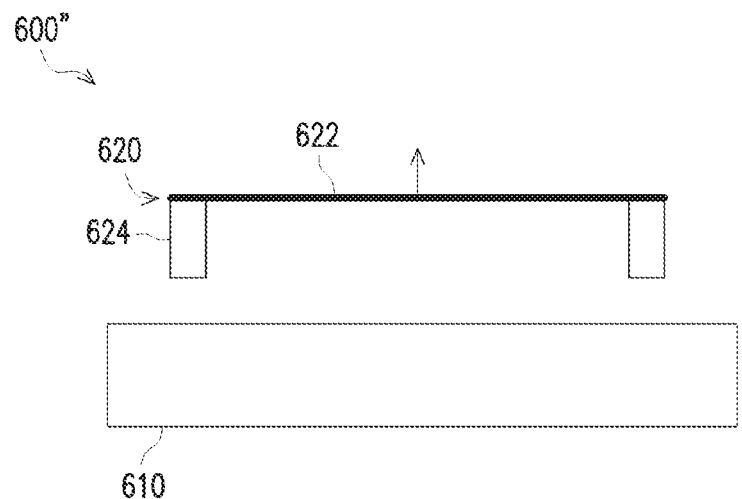

FIG. 6C is a cross-sectional view 600" of a demounting process for pellicle 620 in accordance with some embodiments. In comparison with view 600' (FIG. 6B), view 600" includes pellicle 620 completely separated from mask 610 by lifting pellicle 620 in a direction perpendicular to the top surface of mask 610. By first detaching one side of pellicle 620 from mask 610 prior to lifting pellicle 620 in the direction perpendicular to the top surface of mask 610, a risk of damage to pellicle 620 and mask 610 is reduced. In some embodiments, a same mechanical element is used to lift pellicle 620 as that used to apply force 660 (FIG. 6A). In some embodiments, a different mechanical element is used to lift pellicle 620 as that used to apply force 660.

Following the demounting process, mask 610 is secured in a photolithography arrangement, e.g., photolithography arrangement 100 (FIG. 1). After the photolithography process is completed, mask 610 is removed from the photolithography arrangement and pellicle 620 is reattached to mask 610 for storage of mask 610.

Figure 7:
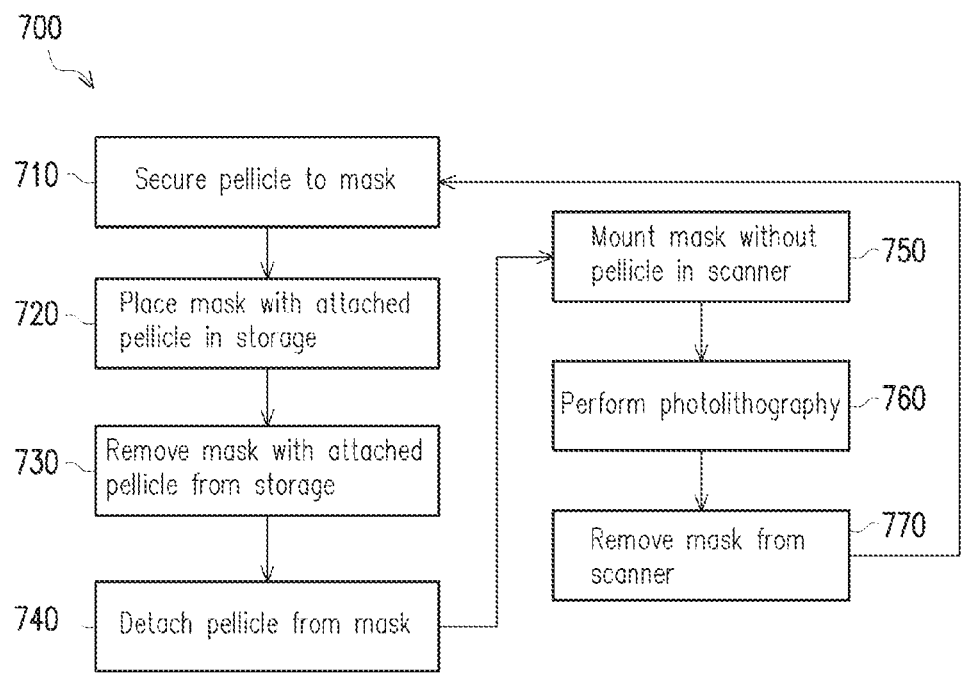
FIG. 7 is a flow chart of a method of using a pellicle in accordance with some embodiments.

FIG. 7 is a flow chart of a method 700 of using a pellicle in accordance with some embodiments. In operation 710, a pellicle is secured to a mask. In some embodiments, the pellicle is secured to the mask by creating a vacuum between the pellicle and the mask, e.g., using a check valve 226 (FIGS. 2A and 2B). In some embodiments, the pellicle is secured to the mask using an electrostatic sticker, e.g., electrostatic sticker 440 (FIG. 4). In some embodiments, the pellicle is secured to the mask using a plurality of micro-suction cups, e.g., micro-suction cups 550 (FIG. 5). In some embodiments, the pellicle is secured to the mask using a different process that does not leave residual adhesive on the mask when the pellicle is later removed. In some embodiments, a region between the mask and the pellicle is purged with an inert gas prior to securing the pellicle to the mask.

In operation 720, the mask is placed in storage with the pellicle attached. In some embodiments, the storage is EUV dual pod. In some embodiments, the storage is a purge rack capable of purging an internal environment to help preserve the mask. In some embodiments, the mask is placed in storage using a robot arm, a conveyor belt or another suitable transfer element. In some embodiments, the mask is placed in storage by a user. In some embodiments, the internal environment of the storage is purged at intervals during the time that the mask is stored. In some embodiments, the intervals are determined based on a storage duration, i.e., how long the mask has been in the storage. In some embodiments, the intervals are determined based on occurrence of events, such as opening a door to the storage or another suitable event.

In operation 730, the mask with the attached pellicle is removed from storage. In some embodiments, the mask is removed from storage using a robot arm, a conveyor belt or another suitable transfer element. In some embodiments, the mask is removed from storage by a user. In some embodiments, the mask is removed from storage using the same element as that used to place the mask into storage. In some embodiments, the mask is removed from storage using a different element from that used to place the mask into storage. In some embodiments, the storage is transferred to a different location within the fab or to a different building prior to removing the mask from storage.

In operation 740, the pellicle is detached from the mask. In some embodiments, the pellicle is detached by releasing a vacuum between the pellicle and the mask. In some embodiments, the pellicle is detached by introducing a positive pressure between the mask and the pellicle. In some embodiments, the pellicle is removed by exerting a force on one side of the pellicle to separate the side of the pellicle from the mask and then lifting the pellicle off the mask, e.g., as in the demounting process of FIGS. 6A, 6B and 6C. In some embodiments, the pellicle is detached from the mask in a controlled environment. In some embodiments, the pellicle is detached from the mask in an uncontrolled environment, e.g., air.

In operation 750, the mask, without the pellicle, is mounted in a scanner. The scanner is a photolithography arrangement, e.g., photolithography arrangement 100 (FIG. 1). A pressure inside the scanner is lower than a pressure outside the scanner, which helps to reduce a rate of carbon growth on the mask. In some embodiments, a robot arm is used to mount the mask in the scanner. In some embodiments, a user mounts the mask in the scanner. In some embodiments, the mask mounted in the scanner using a same element as that used to remove the mask from storage and to place the mask into storage. In some embodiments, the mask mounted in the scanner using a different element from that used to remove the mask from storage or to place the mask into storage.

In operation 760, a photolithography process is performed using the mask. In the photolithography process the pattern on the mask is transferred to a wafer. In some embodiments, the photolithography uses UV light, such as EUV light or VUV light. A dwell time of the photolithography process is shorter than other approaches that keep the pellicle on the mask during the photolithography process. In some embodiments, the photolithography process is repeated multiple times using the same mask without removing the mask from the scanner.

In operation 770, the mask is removed from the scanner. Following removal of the mask from the scanner the pellicle is reattached to the mask in operation 710. In some embodiments, a robot arm is used to remove the mask from the scanner. In some embodiments, a user removes the mask from the scanner. In some embodiments, the mask removed from the scanner using a same element as that used mount the mask in the scanner, to remove the mask from storage, and to place the mask into storage. In some embodiments, the mask removed from the scanner using a different element from that used mount the mask in the scanner, to remove the mask from storage, or to place the mask into storage.

In comparison with other approaches, method 700 has an increased production throughput because of the reduced dwell time during the photolithography process. Method 700 also helps to prolong the useful life of the mask because cleaning steps to remove residual adhesive are avoided. In some embodiments, method 700 helps to process technology nodes equal to or small than N10 because carbon growth on the mask is reduced or avoided by storing the mask with a vacuum between the mask and the pellicle.

In some embodiments, method 700 includes additional operations, such as purging the mask with an inert gas prior to operation 710. In some embodiments, an order of operations of method 700 is adjusted, such as attaching the pellicle to the mask after the mask is in storage. In some embodiments, at least one operation of method 700 is omitted. For example, in some embodiments, operation 720 is omitted if the mask is not stored prior to use in a scanner.

The above description provides several embodiments for securing a pellicle to a mask in order to protect the mask from foreign particles adhering to the mask. The pellicle is removable from the mask without leaving residual adhesive on the mask. Avoiding residual adhesive on the mask helps to prolong the useful life of the mask by subjecting the mask to fewer, if any, cleaning processes. In some embodiments, the pellicle is secured to the mask using a vacuum, which helps to reduce the risk of carbon growth on the mask. The reduced carbon growth permits the use of the mask with technology nodes equal to or smaller than N10.

One aspect of this description relates to a pellicle. The pellicle includes a frame. The frame includes a check valve, wherein the check valve is configured to permit gas flow from an interior of the pellicle to an exterior of the pellicle. The frame further includes a recess in a bottom surface of the frame. The pellicle further includes a membrane extending across the frame. The pellicle further includes a gasket configured to fit within the recess.

Another aspect of this description relates to a method of using a pellicle. The method includes securing the pellicle to a mask, wherein the pellicle extends around a pattern on the mask. The method further includes detaching the pellicle from the mask. The method further includes mounting the mask in a scanner, wherein mounting the mask in the scanner comprises mounting the mask in the scanner without performing a cleaning process on the mask. The method further includes performing a photolithography process, using the scanner, to transfer the pattern on the mask to a wafer.

Still another aspect of this description relates to a method of using a pellicle. The method includes securing the pellicle to a mask, wherein the pellicle extends around a pattern on the mask. Securing the pellicle to the mask includes securing the pellicle to the mask without the use of an adhesive. The method further includes detaching the pellicle from the mask and mounting the mask in a scanner. The method further includes performing a photolithography process, using the scanner, to transfer the pattern on the mask to a wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle comprising:
   a frame, wherein the frame comprises:
      an outer surface and an inner surface, wherein the inner surface defines an interior of the pellicle;
      a check valve extending from the outer surface to the inner surface, wherein the check valve is configured to permit gas flow from the interior of the pellicle to an exterior of the pellicle; and
      a bottom surface of the frame defines only a single recess therein;
   a membrane extending across the frame; and
   a gasket configured to fit within the single recess.

2. The pellicle of claim 1, wherein the check valve comprises a ball check valve.

3. The pellicle of claim 1, wherein a first distance between a bottom surface of the check valve in the frame and a bottom surface of the gasket is greater than a second distance between a bottom surface of the frame and the bottom surface of the gasket.

4. The pellicle of claim 1, wherein the frame comprises a plurality of check valves.

5. The pellicle of claim 1, wherein a depth of the single recess is less than or equal to a thickness of the gasket.

6. A method of using a pellicle, the method comprising:
   securing the pellicle to a mask, wherein the pellicle extends around a pattern on the mask, and securing the pellicle to the mask comprises:
      applying a vacuum between the pellicle and the mask using a check valve in a frame supporting the pellicle, and
      sealing the vacuum using only a single gasket in a recess in the frame;
   releasing the vacuum;
   detaching the pellicle from the mask by exerting a force directly on a first side of the pellicle, wherein the first side of the pellicle is detached prior to detaching a second side of the pellicle from the mask;
   mounting the mask in a scanner, wherein mounting the mask in the scanner comprises mounting the mask in the scanner without performing a cleaning process on the mask; and
   performing a photolithography process, using the scanner, to transfer the pattern on the mask to a wafer.

7. The method of claim 6, wherein securing the pellicle to the mask comprises securing the pellicle to the mask using the check valve separated from the recess.

8. The method of claim 6, wherein securing the pellicle to the mask comprises securing the pellicle to the mask using the check valve extending through an entirety of the frame, and the check valve being separated from a surface of the mask.

9. The method of claim 6, wherein securing the pellicle to the mask comprises using a ball check valve.

10. The method of claim 9, further comprising purging a region between the mask and the pellicle with an inert gas prior to forming the vacuum.

11. The method of claim 9, further comprising maintaining the vacuum between the pellicle and the mask using the ball check valve.

12. The method of claim 6, wherein detaching the pellicle from the mask comprises exerting the force on the first side of the pellicle at an angle to a frame of the pellicle.

13. The method of claim 12, further comprising lifting the pellicle in a direction perpendicular to a top surface of the mask to separate the second side of the pellicle from the mask.

14. A method of using a pellicle, the method comprising:
   securing the pellicle to a mask, wherein the pellicle extends around a pattern on the mask, and securing the pellicle to the mask comprises:
      forming a vacuum between the pellicle and the mask using a check valve extending through a frame supporting the pellicle, wherein an entirety of the check valve is separated from a surface of the mask by a portion of the frame, and a seal is formed using only a single gasket provided in a recess in the frame;

releasing the vacuum;

separating one side of the pellicle from the mask by a distance by applying a force directly on the one side of the pellicle;

detaching the entirety of the pellicle from the mask, after the separating of the one side of the pellicle from the mask;

mounting the mask in a scanner; and performing a photolithography process, using the scanner, to transfer the pattern on the mask to a wafer.

15. The method of claim 14, wherein securing the pellicle to the mask comprises forming the vacuum using a ball check valve.

16. The method of claim 15, further comprising purging a region between the mask and the pellicle with an inert gas prior to forming the vacuum.

17. The method of claim 12, wherein the angle ranges from about 20 degrees to about 80 degrees.

* * * * *